(12) United States Patent
Li et al.

(10) Patent No.: US 10,181,578 B2
(45) Date of Patent: Jan. 15, 2019

(54) ORGANIC LIGHT-EMITTING DIODE (OLED) DEVICE, MANUFACTURING METHOD THEREOF AND DISPLAY DEVICE

(71) Applicants: BOE Technology Group Co., Ltd., Beijing (CN); Hefei BOE Optoelectronics Technology Co., Ltd., Hefei (CN)

(72) Inventors: Rui Li, Beijing (CN); Dezhi Xu, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 38 days.

(21) Appl. No.: 15/322,328

(22) PCT Filed: Dec. 11, 2015

(86) PCT No.: PCT/CN2015/097123
§ 371 (c)(1),
(2) Date: Dec. 27, 2016

(87) PCT Pub. No.: WO2017/028412
PCT Pub. Date: Feb. 23, 2017

(65) Prior Publication Data
US 2017/0214000 A1    Jul. 27, 2017

(30) Foreign Application Priority Data

Aug. 20, 2015 (CN) .................. 2015 1 0516240

(51) Int. Cl.
*H01L 51/52* (2006.01)
*H01L 51/56* (2006.01)
*H01L 51/00* (2006.01)

(52) U.S. Cl.
CPC ........ *H01L 51/5256* (2013.01); *H01L 51/004* (2013.01); *H01L 51/0035* (2013.01);
(Continued)

(58) Field of Classification Search
CPC . H01L 51/5256; H01L 51/56; H01L 51/0035; H01L 51/004; H01L 51/5246
See application file for complete search history.

(56) References Cited

U.S. PATENT DOCUMENTS

| 9,070,889 | B2 | 6/2015 | Lee et al. |
| 2012/0256202 | A1 | 10/2012 | Lee et al. |
| 2016/0293897 | A1* | 10/2016 | Quan .................. H01L 51/5253 |

FOREIGN PATENT DOCUMENTS

| CN | 103545463 A | 1/2014 |
| CN | 103887446 A | 6/2014 |

(Continued)

OTHER PUBLICATIONS

Apr. 22, 2016—(WO) International Search Report and Written Opinion (Appn PCT/CN2015/097123 with English Tran.

(Continued)

*Primary Examiner* — Douglas Menz
(74) *Attorney, Agent, or Firm* — Banner & Witcoff, Ltd.

(57) ABSTRACT

An organic light-emitting diode (OLED) display device, a manufacturing method thereof and a display device are disclosed. The OLED device includes: a first substrate; an OLED disposed on the first substrate; at least one encapsulation layer disposed on the OLED; a bonding layer disposed on the at least one encapsulation layer; and a second substrate disposed on the bonding layer. A concave-convex structure is provided on at least one surface of the at least one encapsulation layer. The OLED display device can (Continued)

reduce the damage of moisture and oxygen on the OLED device and improve the moisture and oxygen resistance of the OLED device.

19 Claims, 2 Drawing Sheets

(52) U.S. Cl.
CPC ...... *H01L 51/0097* (2013.01); *H01L 51/5246* (2013.01); *H01L 51/5275* (2013.01); *H01L 51/56* (2013.01); *H01L 2251/301* (2013.01); *H01L 2251/303* (2013.01); *H01L 2251/5338* (2013.01); *H01L 2251/558* (2013.01)

(56) References Cited

FOREIGN PATENT DOCUMENTS

| | | |
|---|---|---|
| CN | 104538425 A | 4/2015 |
| CN | 105140417 A | 12/2015 |

OTHER PUBLICATIONS

Sep. 14, 2016—(CN) First Office Action Appn 201510516240.1 with English Tran.
Feb. 3, 2017—(CN) Second Office Action Appn 201510516240.1 with English Tran.

\* cited by examiner

ORGANIC LIGHT-EMITTING DIODE (OLED) DEVICE, MANUFACTURING METHOD THEREOF AND DISPLAY DEVICE

The application is a U.S. National Phase Entry of International Application No. PCT/CN2015/097123 filed on Dec. 11, 2015, designating the United States of America and claiming priority to Chinese Patent Application No. 201510516240.1, filed Aug. 20, 2015. The present application claims priority to and the benefit of the above-identified applications and the above-identified applications are incorporated by reference herein in their entirety.

TECHNICAL FIELD

Embodiments of the present disclosure relate to an organic light-emitting diode (OLED) display device, a manufacturing method thereof and a display device.

BACKGROUND

The OLED display technology has become the next generation of display technology with broad prospect for development due to the advantages of light weight, thin profile, wide viewing angle, autoluminescence, continuous and adjustable luminous color, low cost, rapid response speed, low power consumption, low driving voltage, wide operating temperature range, simple manufacturing technique, high luminous efficiency, flexible display, etc.

Researches have indicated that components such as moisture and oxygen in the air have large influence on the service life of OLED devices in OLED displays. The reasons include that: in the operating process of an OLED device, electrons must be injected from a cathode; the work function of the cathode is required to be the lower the better; but the cathode is generally made from a metallic material such as aluminum, magnesium or calcium, has active chemical properties, and tends to react with penetrated moisture and oxygen; in addition, moisture and oxygen also tends to undergo chemical reaction with a hole transport layer (HTL) and an electron transport layer (ETL) of the OLED device, and the reactions will result in the failure of the OLED device. Therefore, if the OLED device is effectively encapsulated, so that functional layers of the OLED device can be fully isolated from the components such as moisture and oxygen in the air, and hence the service life of the OLED device can be greatly prolonged, and consequently the service life of the OLED display can be prolonged.

The technical problem to be solved is to improve the moisture and oxygen resistance of the OLED device.

SUMMARY

The objective of the embodiments of the present disclosure includes providing an OLED device, a manufacturing method thereof and a display device, so as to reduce the damage of moisture and oxygen in the air on the OLED device and improve the moisture and oxygen resistance of the OLED device.

Embodiments of the present disclosure provide an OLED device, a manufacturing method thereof and a display device. The OLED device comprises: a first substrate, an OLED disposed on the first substrate, at least one encapsulation layer disposed on the OLED, a bonding layer disposed on the at least one encapsulation layer, and a second substrate disposed on the bonding layer, wherein a concave-convex structure is provided on at least one surface of the encapsulation layer.

As the concave-convex structure is provided on the surface of the encapsulation layer, the concave-convex structure on the surface of an inorganic layer will increase the surface area of the inorganic layer and hence improve the moisture and oxygen resistance; the concave-convex structure on the surface of an organic layer will increase the contact area between the organic layer and the inorganic layer, improve the bonding effect, and meanwhile improve the water resistance of the organic layer as the organic layer has water absorption. Therefore, compared with the state of art, the proposal can reduce the damage caused by moisture and oxygen in the air on the OLED device and improve the moisture and oxygen resistance of the OLED device.

In some embodiments, the OLED device comprises at least two encapsulation layers; and the at least two encapsulation layers include an organic layer and an inorganic layer which are alternately arranged.

The alternative design of the organic layer and the inorganic layer fully utilizes the superior moisture and oxygen resistance of the inorganic layer, and the organic layer therein has water absorption and can have good bonding effect between the OLED device and the inorganic layer.

In some embodiments, the OLED device comprises two encapsulation layers; the two encapsulation layers include an organic layer disposed on the OLED and an inorganic layer disposed on the organic layer; a concave-convex structure is provided on an upper surface of the organic layer; concave-convex structures are respectively provided on both an upper surface and a lower surface of the inorganic layer; and the concave-convex structure on the upper surface of the organic layer is coupled with the concave-convex structure on the lower surface of the inorganic layer.

The design of one organic layer and one inorganic layer can achieve good waterproof effect. The superimposition of a plurality of layers can satisfy high waterproof requirement in the case of long-term use in harsh and humid environment, but will result in transmittance loss. As the organic layer does not require etching process and hence there is no risk of damaging the OLED in the forming process, the organic layer makes direct contact with the OLED.

In some embodiments, the thickness of the organic layer is 1-2 μm, and the thickness of the inorganic layer is 0.1-1 μm.

An overly thin inorganic layer may suffer from the risk of being etched through in the process of etching the concave-convex structure, and an overly thick inorganic layer will waste materials. The thickness of the inorganic layer must be adjusted according to product requirements in specific product design processes.

In some embodiments, the organic layer includes a polyacrylate organic layer.

In some embodiments, the inorganic layer includes a silicon nitride inorganic layer or a silicon oxynitride inorganic layer.

In some embodiments, the bonding layer is a thermosetting material bonding layer. In some embodiments, the thermosetting material bonding layer includes a thermosetting phenolic resin bonding layer or an ultraviolet (UV) curing adhesive bonding layer.

In some embodiments, the polyacrylate organic layer is made from negative polyacrylate materials. Thermosetting phenolic resin materials can be gradually hardened and molded by chemical reaction after heating and cannot be softened after secondary heating. UV curing adhesive can absorb UV energy under UV irradiation and generate active free radicals or cations, so that the bonding layer can be finally cured after a series of chemical reactions.

In some embodiments, the first substrate and/or the second substrate are flexible substrates. In some embodiments, the flexible substrate includes a polybutylene terephthalate (PBT) substrate or a polyethylene terephthalate (PET) substrate.

The substrate may be a flexible substrate and is applied to a flexible display device. The material of the flexible substrate is not limited and, for instance, may include at least one selected from the group consisting of polyimide, polycarbonate, polyacrylate, polyetherimide, polyether sulfone, PET or polyethylene naphthalate (PEN). In addition, the substrate may also be a common rigid substrate, e.g., a glass substrate and a resin substrate.

In some embodiments, the concave-convex structure includes a square sectional concave-convex structure, a wavy sectional concave-convex structure or a zigzag sectional concave-convex structure.

The concave-convex structure can increase the contact area between the encapsulation layers and between the encapsulation layer and the bonding layer, and can improve the moisture and oxygen resistance and enhance the bonding effect.

The embodiment of the present disclosure further provides a method for manufacturing an OLED device, which comprises: forming an OLED on a first substrate; forming at least one encapsulation layer on the OLED, in which a concave-convex structure is provided on at least one surface of the encapsulation layer; forming a bonding layer on the at least one encapsulation layer; and bonding the second substrate with the bonding layer.

In the technical proposal of the method embodiment, as the concave-convex structure is formed on the surface of the encapsulation layer, the concave-convex structure on the surface of an inorganic layer will increase the surface area of the inorganic layer and hence improve the moisture and oxygen resistance; the concave-convex structure on the surface of an organic layer will increase the contact area between the organic layer and the inorganic layer, improve the bonding effect, and meanwhile improve the water resistance of the organic layer as the organic layer has water absorption. Therefore, compared with the state of art, the proposal can reduce the damage of moisture and oxygen in the air on the OLED device and improve the moisture and oxygen resistance of the OLED device.

In some embodiments, the step of forming the at least one encapsulation layer on the OLED includes: forming the concave-convex structure on an upper surface of the encapsulation layer.

In some embodiments, the step of forming the concave-convex structure on the upper surface of the encapsulation layer specifically includes: forming an organic layer on the OLED; forming a concave-convex structure on an upper surface of the organic layer by exposure and development processes; forming an inorganic layer on a surface of the organic layer; and forming a concave-convex structure on an upper surface of the inorganic layer by etching process.

The alternative design of the organic layer and the inorganic layer can fully utilize the superior moisture and oxygen resistance of the inorganic layer, and the organic layer therein has water absorption and can have good bonding function between the OLED device and the inorganic layer.

The embodiment of the present disclosure further provides a display device, which comprises the OLED device provided by any foregoing technical proposal. As the moisture and oxygen resistance of the OLED device is improved, the display device has good product quality.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In order to improve the moisture and oxygen resistance of an OLED device, embodiments of the present disclosure provide an OLED device, a manufacturing method thereof and a display device. In the technical proposal of the embodiment of the present disclosure, as a concave-convex structure is designed on the surface of the encapsulation layer, the concave-convex structure on a surface of an inorganic layer will increase the surface area of the inorganic layer and hence improve the moisture and oxygen resistance; the concave-convex structure on the surface of an organic layer will increase the contact area between the organic layer and the inorganic layer, improve the bonding effect, and also improve the water resistance of the organic layer as the organic layer has water absorption. Therefore, compared with the related art, the proposal can reduce the damage of moisture and oxygen in the air on the OLED device and improve the moisture and oxygen resistance of the OLED device.

Further detailed description will be given below to the present disclosure with reference to the following embodiments for more clear understanding of the objective, the technical proposals and the advantages of the present disclosure.

Figure 1:
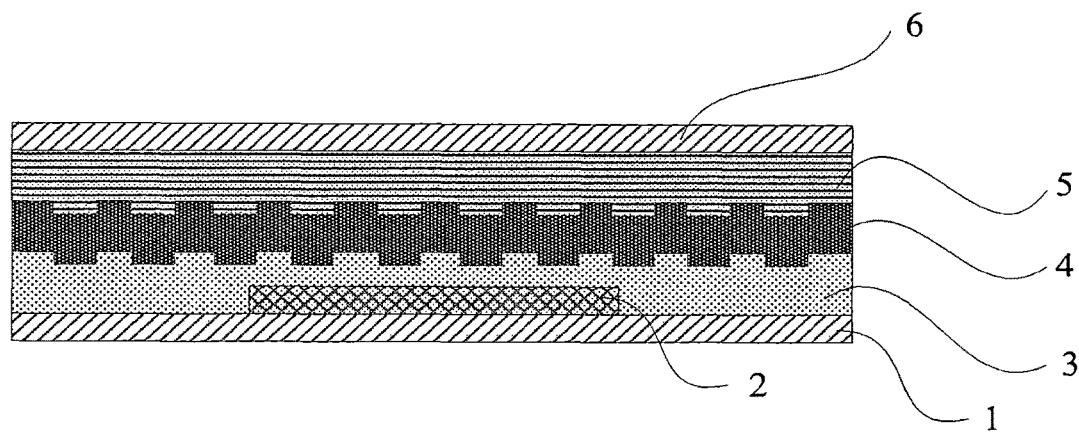
FIG. 1 is a schematic diagram of an OLED device provided by an embodiment of the present disclosure.

As illustrated in FIG. 1, the embodiment of the present disclosure provides an OLED device, which comprises: a first substrate 1, an OLED 2 disposed on the first substrate 1, an encapsulation layer disposed on the OLED 2, a bonding layer 5 disposed on the encapsulation layer, and a second substrate 6 disposed on the bonding layer 5; a concave-convex structure is formed on at least one surface of the encapsulation layer.

As illustrated in FIG. 1, in the technical proposal of the embodiment of the present disclosure, the encapsulation layer includes an organic layer 3 and an inorganic layer 4. But in actual application, the encapsulation layer may include the organic layer only or the inorganic layer only or may also include a plurality of layers formed by the alternative design of the organic layers and the inorganic layers. The alternative design of the organic layers and the inorganic layers fully utilizes the superior moisture and oxygen resistance of the inorganic layer, and the organic layer therein has capability of water absorption and can have good bonding function between the OLED device and the inorganic layer.

As illustrated in FIG. 1, the encapsulation layer of the OLED device includes an organic layer 3 disposed on the OLED and an inorganic layer 4 disposed on the organic layer 3; a concave-convex structure is formed on the upper surface of the organic layer 3; a concave-convex structure is formed on both the upper surface and the lower surface of the inorganic layer 4; and the concave-convex structure on the upper surface of the organic layer is engaged or coupled with the concave-convex structure on the lower surface of the inorganic layer. As the inorganic layer is directly formed on the organic layer, the concave-convex structure engaged with the upper surface of the organic layer will be formed on the lower surface of the inorganic layer.

The design of one organic layer plus one inorganic layer can achieve good waterproof effect. The stack of a plurality of layers can satisfy high waterproof requirement in the case of long-term use in harsh and humid environment, but may bring about transmittance loss. As the organic layer does not require etching process and there is no risk of damaging the OLED in the forming process, the organic layer makes direct contact with the OLEDs.

In the technical proposal of the embodiment of the present disclosure, the thickness of the organic layer is 1 μm-2 μm, and the thickness of the inorganic layer is 0.1 μm-1 μm.

An overly thin organic or inorganic layer may suffer from the risk in the process of etching the concave-convex structure that the layer is etched through, while an overly thick organic or inorganic layer may bring about waste of raw material. The thickness of the organic or inorganic layer must be adjusted according to product requirements in a specific product design processes.

In the technical proposal of the embodiment of the present disclosure, the material of the organic layer may be polyacrylate series. In one embodiment, the material of the organic layer may be negative type polyacrylate series.

In the technical proposal of the embodiment of the present disclosure, the inorganic layer may be made from silicon nitride or silicon oxynitride materials.

In the technical proposal of the embodiment of the present disclosure, the bonding layer adopts a thermosetting material bonding layer which includes a thermosetting phenolic resin bonding layer or a UV curing adhesive bonding layer.

Thermosetting phenolic resin materials can be gradually hardened and molded by chemical reaction after heating and cannot be softened after secondary heating. UV curing adhesive can absorb UV energy under UV irradiation and generate active free radicals or cations, so that the bonding layer can be finally cured after a series of chemical reactions.

The first substrate and/or the second substrate may be flexible substrates and are applied in a flexible display device. The material of the flexible substrate is not limited herein and, for instance, may include at least one selected from the group consisting of polyimide, polycarbonate, polyacrylate, polyetherimide, polyether sulfone, PET or PEN. In the embodiment of the present disclosure, the material of the flexible substrate may adopt a PBT substrate or a PET substrate. In addition, the first substrate and the second substrate may also be a common rigid substrate, e.g., a glass substrate or a resin substrate. The materials of the first substrate and the second substrate are not limited. For instance, in some embodiments, the first substrate may be a flexible substrate and the second substrate is a rigid substrate; or in some embodiments, the first substrate is a rigid substrate and the second substrate is a flexible substrate; or in some embodiments, both the first substrate and the second substrate are flexible substrates or rigid substrates.

As illustrated in FIG. 1, the concave-convex structure formed on the encapsulation layer is a square sectional concave-convex structure, but is not limited thereto in practical conditions. The concave-convex structure may also be a wavy sectional concave-convex structure, or a zigzag sectional concave-convex structure, or a concave-convex structure of another shape. The concave-convex structure can increase the contact area between the encapsulation layers and between the encapsulation layer and the bonding layer and can improve the moisture and oxygen resistance and enhance the bonding effect.

Figure 2:
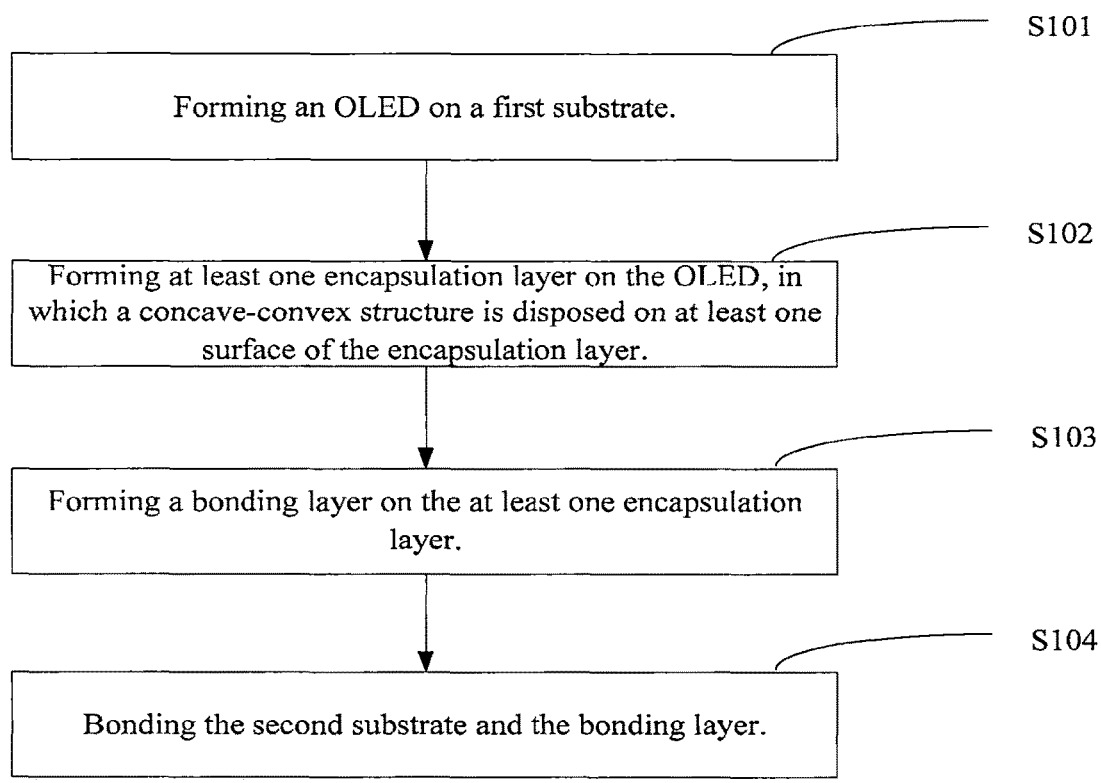
FIG. 2 is a flowchart of a method for manufacturing an OLED device provided by an embodiment of the present disclosure.

The embodiment further provides a method for manufacturing an OLED device, which, as shown in FIG. 2, comprises the following steps:

S101: forming OLEDs on a first substrate;

S102: forming at least one encapsulation layer on the OLEDs, in which a concave-convex structure is formed on at least one surface of the encapsulation layer;

S103: forming a bonding layer on the at least one encapsulation layer; and

S104: bonding the second substrate with the bonding layer.

In the technical proposal of the embodiment of the present disclosure, the process of manufacturing the OLED device as shown in FIG. 1 must include the following steps: firstly, forming the organic layer by coating an organic film on the OLEDs, and forming the concave-convex structure on the organic layer; secondly, depositing one layer of inorganic substances on the surface of the organic layer by plasma enhanced chemical vapor deposition (PECVD), and forming the concave-convex structure on the upper surface of the inorganic layer; and finally, coating one layer of adhesive film (bonding layer) on the inorganic layer and bonding the first substrate and the second substrate after the curing of the adhesive film.

In some embodiments, the step of forming the at least one encapsulation layer on the OLEDs includes: forming a concave-convex structure on an upper surface of the encapsulation layer.

In the technical proposal of the embodiment of the present disclosure, the required concave-convex structure is obtained after performing soft baking, exposure and development processes on the OLED device coated with the organic film. The process of forming the concave-convex structure on the surface of the inorganic layer must include the following steps: firstly, coating photoresist on the surface of the inorganic layer and performing exposure and development; and secondly, etching the inorganic layer not covered by the photoresist by a dry etching process. Of course, the process of forming the concave-convex structure may also adopt other patterning processes such as a laser engraving process.

Figure 3:
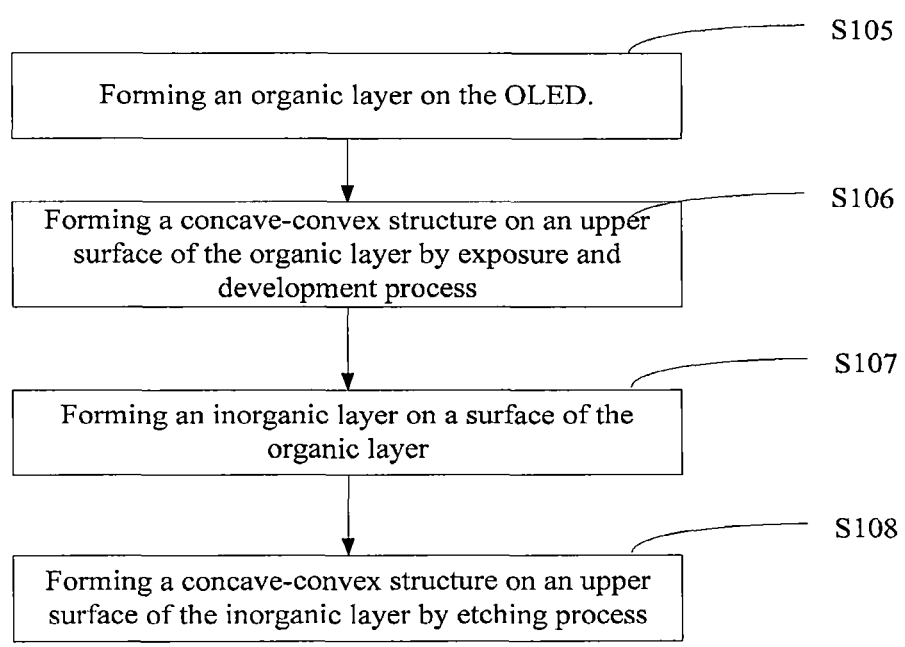
FIG. 3 is a flowchart of a process for forming a concave-convex structure of an encapsulation layer of the OLED device provided by the embodiment of the present disclosure.

In some embodiments, the step of forming the concave-convex structure on the upper surface of the encapsulation layer specifically includes the following steps (as shown in FIG. 3):

S105: forming an organic layer on the OLEDs;

S106: forming a concave-convex structure on an upper surface of the organic layer by exposure and development processes;

S107: forming an inorganic layer on a surface of the organic layer; and

S108: forming a concave-convex structure on an upper surface of the inorganic layer by etching process.

In the technical proposal of the embodiment of the present disclosure, as a concave-convex structure is formed on the surface of the encapsulation layer, the concave-convex structure on a surface of an inorganic layer will increase the surface area of the inorganic layer and hence improve the moisture and oxygen resistance; the concave-convex structure formed on the surface of an organic layer will increase the contact area between the organic layer and the inorganic layer, improve the bonding effect, and meanwhile improve the water resistance of the organic layer as the organic layer has water absorption. Therefore, compared with the state of art, the proposal can reduce the damage caused by moisture and oxygen in the air on the OLED device and improve the moisture and oxygen resistance of the OLED device.

The embodiment of the present disclosure further provides a display device, which comprises the OLED device provided by any foregoing technical proposal. As the moisture and oxygen resistance of the OLED device is improved, the display device has good product quality. The type of the display device is not limited. The display device may be a common flat panel display device and may also be a flexible display device. The specific type of the display device may be a display, e-paper, a tablet PC, a TV, an intelligent display label, an intelligent display card, etc.

What are described above is related to the illustrative embodiments of the disclosure only and not limitative to the scope of the disclosure; the scopes of the disclosure are defined by the accompanying claims.

The application claims priority to the Chinese patent application No. 201510516240.1, filed Aug. 20, 2015, the entire disclosure of which is incorporated herein by reference as part of the present application.

The invention claimed is:

1. An organic light-emitting diode (OLED) device, comprising:
    a first substrate;
    an OLED disposed on the first substrate;
    at least one encapsulation layer disposed on the OLED;
    a bonding layer disposed on the at least one encapsulation layer; and
    a second substrate disposed on the bonding layer, wherein
    a concave-convex structure is provided on at least one surface of the at least one encapsulation layer, the at least one encapsulation layer includes an organic layer disposed on the OLED and an inorganic layer disposed on the organic layer, a concave-convex structure is provided on an upper surface of the organic layer, concave-convex structures are respectively provided on both an upper surface and a lower surface of the inorganic layer, and the concave-convex structure on the upper surface of the organic layer is coupled with the concave-convex structure on the lower surface of the inorganic layer.

2. The OLED device according to claim 1, wherein the OLED device comprises at least two encapsulation layers; and the at least two encapsulation layers include an organic layer and an inorganic layer which are alternately arranged.

3. The OLED device according to claim 1, wherein a thickness of the organic layer is 1-2 μm, and a thickness of the inorganic layer is 0.1-1 μm.

4. The OLED device according to claim 2, wherein the organic layer includes a polyacrylate organic layer.

5. The OLED device according to claim 2, wherein the inorganic layer includes a silicon nitride inorganic layer or a silicon oxynitride inorganic layer.

6. The OLED device according to claim 1, wherein the bonding layer is a thermosetting material bonding layer which includes a thermosetting phenolic resin bonding layer or an ultraviolet (UV) curing adhesive bonding layer.

7. The OLED device according to claim 1, wherein the first substrate and/or the second substrate is a flexible substrate which includes a polybutylene terephthalate (PBT) substrate or a polyethylene terephthalate (PET) substrate.

8. The OLED device according to claim 1, wherein the concave-convex structure includes a square sectional concave-convex structure, a wavy sectional concave-convex structure or a zigzag sectional concave-convex structure.

9. A display device, comprising the OLED device according to claim 1.

10. The OLED device according to claim 2, wherein the OLED device comprises two encapsulation layers.

11. The OLED device according to claim 1, wherein the organic layer includes a polyacrylate organic layer.

12. The OLED device according to claim 1, wherein the inorganic layer includes a silicon nitride inorganic layer or a silicon oxynitride inorganic layer.

13. The OLED device according to claim 2, wherein the bonding layer is a thermosetting material bonding layer which includes a thermosetting phenolic resin bonding layer or an ultraviolet (UV) curing adhesive bonding layer.

14. The OLED device according to claim 2, wherein the first substrate and/or the second substrate is a flexible substrate which includes a polybutylene terephthalate (PBT) substrate or a polyethylene terephthalate (PET) substrate.

15. The OLED device according to claim 3, wherein the bonding layer is a thermosetting material bonding layer which includes a thermosetting phenolic resin bonding layer or an ultraviolet (UV) curing adhesive bonding layer.

16. The OLED device according to claim 3, wherein the first substrate and/or the second substrate is a flexible substrate which includes a polybutylene terephthalate (PBT) substrate or a polyethylene terephthalate (PET) substrate.

17. A method for manufacturing an OLED device, comprising:
    forming an OLED on a first substrate;
    forming at least one encapsulation layer on the OLED, in which a concave-convex structure is provided on at least one surface of the encapsulation layer, wherein the encapsulation layer includes an organic layer disposed on the OLED and an inorganic layer disposed on the organic layer, a concave-convex structure is provided on an upper surface of the organic layer, concave-convex structures are respectively provided on both an upper surface and a lower surface of the inorganic layer, and the concave-convex structure on the upper surface of the organic layer is coupled with the concave-convex structure on the lower surface of the inorganic layer;
    forming a bonding layer on the at least one encapsulation layer; and
    bonding a second substrate with the bonding layer.

18. The method for manufacturing the OLED device according to claim 17, wherein the forming the at least one encapsulation layer on the OLED comprises:
    forming the concave-convex structure on an upper surface of the encapsulation layer.

19. The method for manufacturing the OLED device according to claim 18, wherein the forming the concave-convex structure on the upper surface of the encapsulation layer specifically comprises:
   forming an organic layer on the OLED;
   forming a concave-convex structure on an upper surface of the organic layer by a exposure and development processes;
   forming an inorganic layer on a surface of the organic layer; and
   forming a concave-convex structure on an upper surface of the inorganic layer by an etching process.

\* \* \* \* \*